United States Patent
Zhou et al.

(10) Patent No.: US 12,040,147 B2
(45) Date of Patent: Jul. 16, 2024

(54) ACOUSTIC SENSING OF THOMSON COIL BASED VACUUM CIRCUIT INTERRUPTER OPERATION

(71) Applicant: EATON INTELLIGENT POWER LIMITED, Dublin (IE)

(72) Inventors: Xin Zhou, Wexford, PA (US); Santhosh Kumar Chamarajanagar Govinda Nayaka, Moon Township, PA (US); Andrew W. Lichauer, McMurray, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 171 days.

(21) Appl. No.: 17/878,207

(22) Filed: Aug. 1, 2022

(65) Prior Publication Data

US 2024/0038469 A1 Feb. 1, 2024

(51) Int. Cl.

| | |
|---|---|
| *H01H 47/00* | (2006.01) |
| *G01R 31/327* | (2006.01) |
| *H01H 50/18* | (2006.01) |
| *H01H 50/44* | (2006.01) |
| *H01H 50/54* | (2006.01) |
| *H01H 50/64* | (2006.01) |
| *H01H 89/00* | (2006.01) |

(52) U.S. Cl.
CPC ......... *H01H 47/002* (2013.01); *G01R 31/327* (2013.01); *H01H 50/18* (2013.01); *H01H 50/44* (2013.01); *H01H 50/54* (2013.01); *H01H 50/641* (2013.01); *H01H 89/00* (2013.01)

(58) Field of Classification Search
None
See application file for complete search history.

(56) References Cited

U.S. PATENT DOCUMENTS

2020/0066468 A1* 2/2020 Wang ..................... H01F 7/123

* cited by examiner

*Primary Examiner* — Farhana A Hoque
(74) *Attorney, Agent, or Firm* — Eckert Seamans Cherin & Mellott, LLC (57) ABSTRACT

An acoustic sensing system for detecting movement of an ultra-fast actuator in a hybrid circuit interrupter is disclosed. The system comprises a number of acoustic sensors structured to perform active or passive position sensing. For active sensing, the sensors emit sound waves toward a number of targeted portions of the actuator moving assembly and detect the positions of the targets based on acoustic signals reflected back to the sensors by the targets. For passive sensing, the sensors detect acoustic wavelets generated as a result of the moving assembly components moving during opening and closing operations. Acoustic signals can propagate through air or solids and thus the sensors can be mounted in a variety of locations within the circuit interrupter. Acoustic sensors are particularly well-suited for the circuit interrupter environment, as they are resilient to the environmental and external factors, such as dust, that can affect the performance of non-acoustic sensors.

20 Claims, 4 Drawing Sheets

ACOUSTIC SENSING OF THOMSON COIL BASED VACUUM CIRCUIT INTERRUPTER OPERATION

FIELD OF THE INVENTION

The disclosed concept relates generally to circuit interrupters, and in particular, to devices for monitoring the performance of actuators in ultra-fast switches.

BACKGROUND OF THE INVENTION

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit interrupters typically include mechanically operated separable electrical contacts, which operate as a switch. When the separable contacts are in contact with one another in a closed state, current is able to flow through any circuits connected to the circuit interrupter. When the separable contacts are not in contact with one another in an open state, current is prevented from flowing through any circuits connected to the circuit interrupter. Circuit interrupters typically include an actuator designed to rapidly close or open the separable contacts, and a trip mechanism, such as a trip unit, which senses a number of fault conditions to trip the separable contacts open automatically using the actuator. Upon sensing a fault condition, the trip unit trips the actuator to move the separable contacts to their open position.

Certain power applications require ultra-fast switches, for which hybrid circuit interrupters offer a suitable solution. Hybrid circuit interrupters employ an electronic interrupter in addition to the mechanical separable contacts, which are often components of an ultra-fast vacuum switch. The electronic interrupter comprises electronic components structured to commutate current after a fault is detected. Once current is commutated from the mechanical vacuum switch to the electronic interrupter, the mechanical separable contacts are able to separate with a reduced risk of arcing. Hybrid circuit interrupters are equipped with control logic that causes the electronic interrupter to turn off quickly after current is commutated, in order to fully open the circuit.

Ultra-fast switches are generally used in situations with low error tolerance and thus, monitoring the performance of an ultra-fast switch is important for detecting performance degradation as early as possible. However, a monitoring system must be capable of operating within relatively restrictive conditions that are unique to ultra-fast switches. In an ultra-fast switch, the displacement of the mechanical separable contacts during an opening stroke is typically very small, e.g. 1-2 millimeters, and occurs very quickly, e.g. in hundreds of microseconds. Accordingly, effective detection of switching performance requires a high-sensitivity sensor. While optical sensors are generally sensitive enough to detect the ultra-fast and very small displacement of mechanical contacts in a hybrid circuit interrupter, dust and particulates can block the line of sight of an optical path.

There is thus room for improvement within monitoring systems for ultra-fast switches in circuit interrupters.

SUMMARY OF THE INVENTION

These needs, and others, are met by embodiments of an acoustic sensing system for detecting movement of an ultra-fast actuator in a hybrid circuit interrupter. The system comprises a number of acoustic sensors structured to operate in either an active mode or a passive mode. In the active mode, the acoustic sensors emit sound waves toward a number of targeted portions of the actuator moving assembly in order to detect the positions of the targeted portions based on acoustic signals reflected back to the sensors by the targeted portions. The acoustic sensors can propagate signals through air or solid materials and thus, for the purpose of operating in the active mode, the acoustic sensors can be mounted anywhere within the circuit interrupter that enables some portion of the moving assembly to fall within the propagation path of the emitted sound waves. In the passive mode, the acoustic sensors detect acoustic wavelets generated by moving components of the circuit interrupter during opening and closing operations. The acoustic sensor is resilient to the environmental and external factors, such as dust, that can affect the performance of non-acoustic sensors.

In accordance with one aspect of the disclosed concept, a hybrid circuit interrupter comprises: a housing; a line conductor structured to connect a load to a power source; a hybrid switch assembly disposed along the line conductor between the power source and the load, the hybrid switch assembly comprising mechanical separable contacts and an electronic interrupter structured to commutate current from the mechanical separable contacts when a fault is detected on the line conductor, one of the mechanical separable contacts being a moving contact structured to move between a closed state and an open state; a Thomson coil actuator structured to open the mechanical separable contacts at ultra-fast speeds; a drive rod operably coupled to the moving separable contact; and an acoustic sensing system comprising a processor and an acoustic sensor in electrical communication with the processor. The Thomson coil actuator comprises: a Thomson coil, a plurality of structural support components structured to remain fixed in place, and a moving assembly comprising a conductive plate. The drive rod is fixedly coupled to the conductive plate. The acoustic sensor is mounted to one of the Thomson coil actuator structural support components and is configured to detect movement of the moving assembly. The processor is configured to determine how much time elapses when the moving assembly moves from one position to another based on movement detected by the acoustic sensor.

In accordance with another aspect of the disclosed concept, a circuit interrupter comprises: a housing; a line conductor structured to connect a load to a power source; mechanical separable contacts disposed along the line conductor between the power source and the load, one of the mechanical separable contacts being a moving contact structured to move between a closed state and an open state; a Thomson coil actuator structured to open the mechanical separable contacts at ultra-fast speeds; a drive rod operably coupled to the moving separable contact; a solenoid actuator structured to open the mechanical separable contacts at normal speeds and to close the mechanical separable contacts; and an acoustic sensing system comprising a processor and an acoustic sensor in electrical communication with the processor. The Thomson coil actuator comprises: a Thomson coil, a plurality of structural support components structured to remain fixed in place, and a moving assembly comprising a conductive plate. The drive rod is fixedly coupled to the conductive plate. The acoustic sensor is mounted to one of the Thomson coil actuator structural support components and is configured to detect movement of the moving assembly. The processor is configured to determine how much time elapses when the moving assembly moves from one position to another, based on movement detected by the acoustic sensor.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, when ordinal terms such as "first" and "second" are used to modify a noun, such use is simply intended to distinguish one item from another, and is not intended to require a sequential order unless specifically stated.

As employed herein, the term "number" shall mean one or an integer greater than one (i.e., a plurality).

As employed herein, the term "processing unit" or "processor" shall mean a programmable analog and/or digital device that can store, retrieve, and process data; a microprocessor; a microcontroller; a microcomputer; a central processing unit; or any suitable processing device or apparatus.

Figure 1:
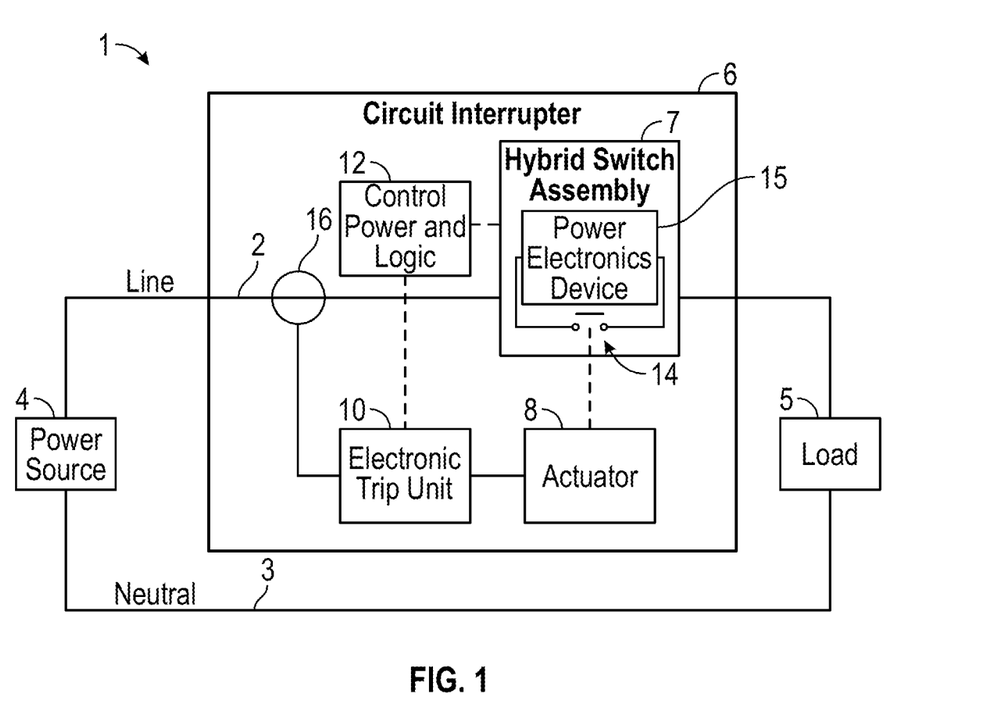
FIG. 1 is a schematic diagram of hybrid circuit interrupter.

FIG. 1 is a schematic diagram of a hybrid circuit interrupter 1 (e.g., without limitation, a circuit breaker), in accordance with an example embodiment of the disclosed concept. The circuit interrupter 1 includes a line conductor 2 and a neutral conductor 3 structured to electrically connect a power source 4 to a load 5. The circuit interrupter 1 is structured to trip open to interrupt current flowing between the power source 4 and load 5 in the event of a fault condition (e.g., without limitation, an overcurrent condition).

The circuit interrupter 1 further includes a housing 6, a hybrid switch assembly 7, an actuator 8, an electronic trip unit 10, and a control power and logic module 12 (referred to hereinafter as "control module 12" for brevity) in electrical communication with the trip unit 10. The hybrid switch assembly 7 comprises a set of mechanical separable contacts 14 and a power electronics device that serves as an electronic interrupter 15. In an exemplary embodiment of the disclosed concept, the mechanical contacts 14 are the stationary and moving contacts of a vacuum interrupter 20 (a vacuum interrupter 20 being shown in FIG. 2). When the mechanical contacts 14 are in a closed state such that they are in contact with one another, current flows through the line conductor 2 and the mechanical contacts 14 to the load 5. The hybrid switch assembly 7 is configured such that, when the mechanical contacts 14 are closed, current does not flow through the electronic interrupter 15 and the electronic interrupter 15 is powered off.

The electronic trip unit 10 is structured to monitor power flowing through the circuit interrupter 1 via a current sensor 16 and/or other sensors and to detect fault conditions based on the power flowing through the circuit interrupter 1. In response to detecting a fault condition, the electronic trip unit 10 is configured to: (1) notify the control module 12 of the fault, so that the control module 12 can commutate the current from the mechanical contacts to the electronic interrupter 15, and (2) output a signal to the actuator 8 to cause the actuator 8 to open the mechanical contacts 14 rapidly so that current cannot reflow through the mechanical contacts 14 after current is interrupted by the electronic interrupter 15. It should be noted that the act of the mechanical contacts 14 separating is also referred to herein as an "opening stroke", and that the space formed between the mechanical contacts 14 after the mechanical contacts 14 are separated is referred to herein as a "contact gap".

When current is commutated to the electronic interrupter 15, the control module 12 is configured to execute a tripping sequence that allows the electronic interrupter 15 to remain powered on for only a short prescribed interval of time and to deactivate the electronic interrupter 15 after the prescribed interval of time, such that the line connection between the power source 4 and the load 5 is broken shortly after the current is commutated, in order to reduce the damage caused by overcurrent or arc flash. Limiting the interval of time during which current can flow through the electronic interrupter 15 is important, as the electronic interrupter 15 comprises a number of components that are not intended to withstand sustained continuous high current flow. It should be noted that the schematic hybrid switch assembly 7 in FIG. 1 is a simplified depiction of a hybrid switch intended to demonstrate how current commutates past mechanical contacts 14 in a hybrid switch, and is not intended to be limiting on the different types of hybrid switch assemblies that can be included in the circuit interrupter 1.

Figure 2:
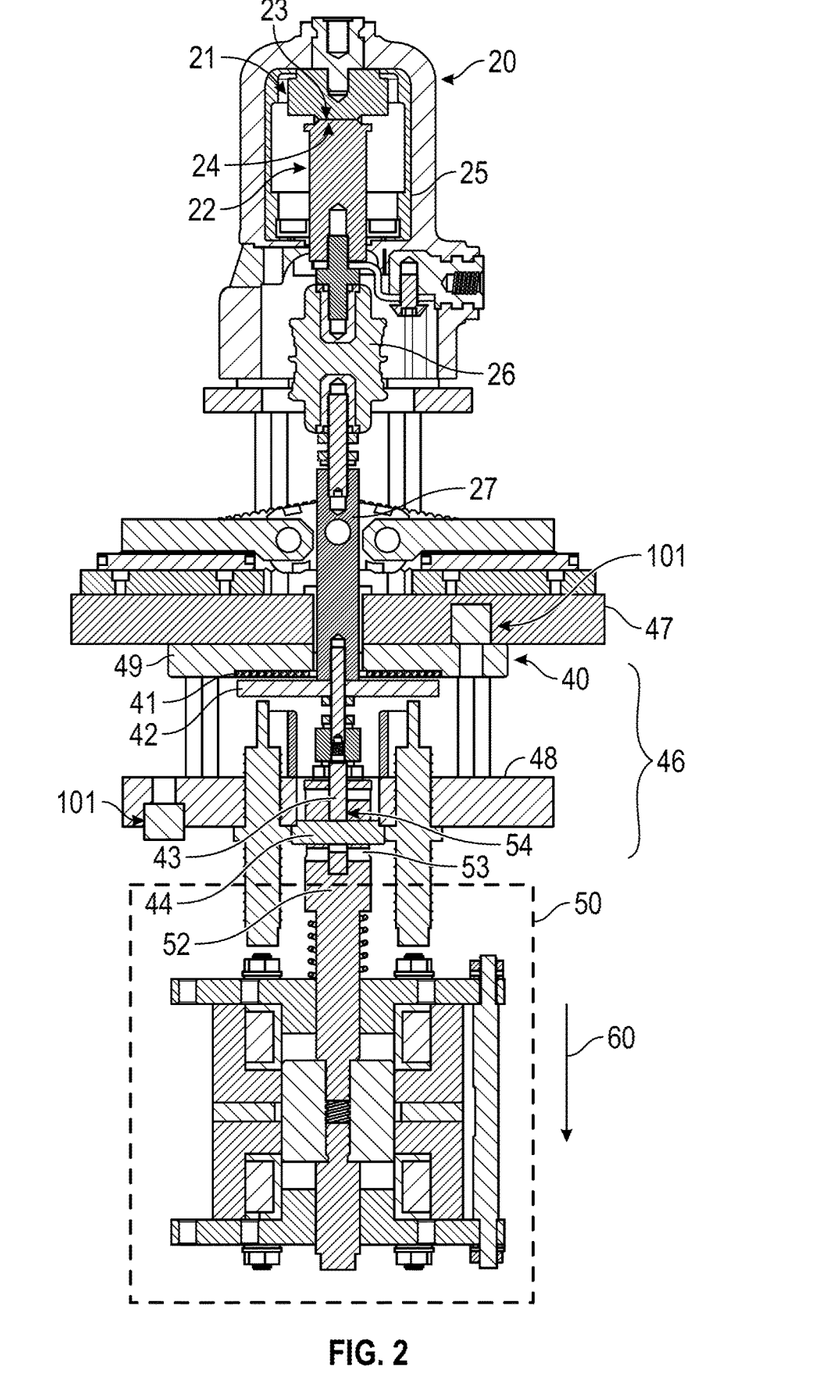
FIG. 2 is a sectional view of a portion of a hybrid circuit interrupter such as the circuit interrupter schematically depicted in FIG. 1, including an acoustic sensing system, in accordance with an example embodiment of the disclosed concept.

FIG. 2 is a sectional view of a portion of a hybrid circuit interrupter, such as the circuit interrupter 1 schematically depicted in FIG. 1, that includes a Thomson coil actuator and an acoustic sensing system for detecting movement of the Thomson coil actuator, in accordance with an exemplary embodiment of the disclosed concept. In FIG. 2, a vacuum interrupter 20 comprising a stationary conductor 21 and a moving conductor 22 is shown. The stationary conductor 21 comprises a stationary contact 23 and the moving conductor 22 comprises a moving contact 24, and it is understood that the stationary and moving contacts 23 and 24 comprise the mechanical separable contacts 14 schematically depicted in FIG. 1. The stationary conductor 21 and the portion of the moving conductor 22 comprising the moving contact 24 are enclosed within a vacuum housing 25. The moving conductor 22 is operably coupled to a drive rod 27 via an isolation coupling 26.

When reference is made herein to the separable contacts 23, 24 being closed, this refers to the contacts being in physical contact with one another such that current can flow between the stationary and moving conductors 21, 22. In addition, when a component of the circuit interrupter 1 is described as being closed or in a closed state or position, this refers to the component being disposed in a position which enables the separable contacts 23, 24 to be closed. Conversely, when reference is made herein to the separable contacts 23, 24 being open, this refers to the separable contacts 23, 24 being physically separated from one another, and when reference is made to the separable contacts 23, 24 being fully open, this refers to the separable contacts 23, 24 reaching an open position that has been predetermined to be sufficient to prevent current from re-flowing between the stationary and moving conductors 21, 22. Thus, when a component of the circuit interrupter 1 is described as being open or disposed in an open state or position, this refers to the component being disposed in a position that keeps the separable contacts 23, 24 separated. As used herein, the term "opening stroke" refers to the act of the opening the separable contacts 23, 24 to the fully open position from the closed state.

The drive rod 27 is further operatively coupled to both a Thomson coil actuator 40 and a solenoid actuator 50 such that each actuator 40, 50 can actuate movement of the drive rod 27. The Thomson coil actuator 40 is structured to separate the mechanical contacts 23, 24 at ultra-fast speeds, while the solenoid actuator 50 is structured to open the mechanical contacts 23, 24 at normal speeds during normal opening operations and re-close the mechanical contacts 23, 24 during reset/closing operations. When the mechanical contacts 23, 24 are closed, separation of the mechanical contacts 23, 24 during an opening stroke is achieved by driving the moving conductor 22 in the opening direction 60 with the drive rod 27, using either the primary actuator 40 or the secondary actuator 50. Having two actuators enables the Thomson coil actuator 40 to only be used in those situations when high-speed opening is truly required, thus extending the life of the device. The Thomson coil and solenoid actuators 40, 50 collectively comprise the actuator 10 schematically depicted in FIG. 1.

The Thomson coil actuator 40 comprises a Thomson coil 41, a conductive plate 42, an actuator coupler 43, and a coupling pin 44. The Thomson coil 41 remains fixed in place relative to the housing 6 of the circuit interrupter 1 at all times, while the conductive plate 42, the actuator coupler 43, and the coupling pin 44 are all fixedly coupled to one another and to the drive rod 27, and are structured to move as a unitary body when actuated by the Thomson coil 41. Accordingly, the conductive plate, 42, the actuator coupler 43, and the coupling pin 44 can be collectively referred to as the Thomson coil moving assembly 46. The solenoid actuator 50 is coupled to the actuator coupler 43 such that, when an opening stroke is actuated by the solenoid actuator 50, the solenoid actuator 50 acts upon the actuator coupler 43 in order to drive the drive rod 27 in the opening direction 60.

The Thomson coil actuator 40 also includes several structural support components that are fixedly coupled relative to the circuit interrupter housing, such as a proximal flange 47, a distal flange 48, and a coil housing 49 which houses the Thomson coil 41 and is fixedly coupled to the proximal flange 47, thus keeping the Thomson coil 41 fixed in place. As used herein, the term "proximal" refers to an end or portion of a component of the circuit interrupter 1 that is disposed closest to the stationary conductor 21, and the term "distal" refers to an end or portion of a component of the circuit interrupter 1 that is disposed furthest away from the stationary conductor 21. In addition, the terms "proximal [ly]" and "distal[ly]" can be used to describe a disposition or direction of one component relative to another, using the stationary conductor 21 as a reference point. Hence, the proximal flange 47 is disposed closer to the stationary conductor 21 than the distal flange 48. In addition, the proximal flange 47 is disposed proximally relative to the coil housing 49 and the distal flange 48 is disposed distally relative to the coil housing 49.

Consistency in the timing of the opening operations of the Thomson coil actuator 40 is critical to the success of the hybrid circuit interrupter 1 in commutating and interrupting current flow at ultra-fast speeds. Thus, there is a need for continuous monitoring and frequent verification of performance of the Thomson coil actuator 40. Specifically, it is important to be able to identify the moment of contact parting (i.e. separation of the mechanical contacts 23, 24) during an opening stroke and to monitor and capture the travel curve of the moving contact 24. As used herein, the term "opening time" refers to the amount of time it takes for the moving contact 24 to start to separate from the stationary contact 23 after the actuator 8 receives an opening command from the trip unit 10. As used herein, the term "response time" refers to the time it takes for the moving contact 24 to move a specified distance away from the stationary contact 22 after the actuator 8 receives an opening command from the trip unit 10. Identifying the moment of contact separation is necessary for determining opening time, and monitoring the travel curve of the moving contact 24 is necessary for determining response time. Monitoring closing of the moving contact 24 is also important for developing a comprehensive profile of actuator performance.

It will be appreciated that directly observing the performance of moving contact 24 during opening or closing is difficult, as the voltage environment within the vacuum housing 25 can have a degradative effect on many types of sensors. Thus, the acoustic sensing system 100 disclosed herein monitors the movement of other components of the Thomson coil moving assembly 46 whose movement causes and corresponds to the movement of the moving contact 24, as detailed further later herein. As previously mentioned, in order to be effective, a monitoring system for an ultra-fast switch needs to be capable of accurately detecting a very small displacement, i.e. <1-2 millimeters, that occurs at very high speeds, i.e. within hundreds of microseconds (<1,000 microseconds). In addition, a monitoring system for an ultra-fast switch should be immune to the effects of dust and particulates, which can present a challenge for optical sensors.

Figure 3:
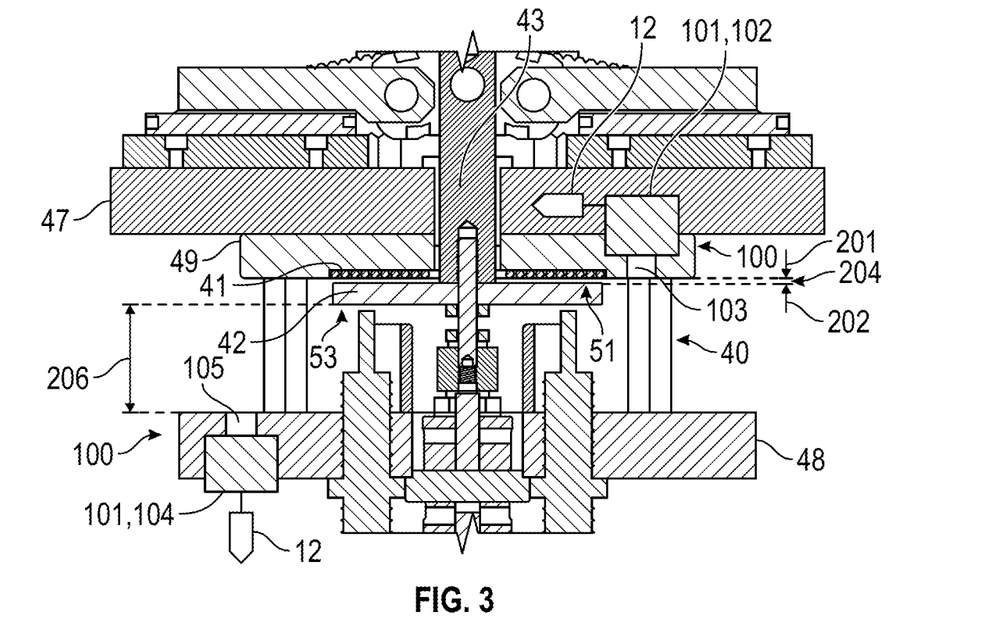
FIG. 3 shows an enlarged sectional view of a Thomson coil actuator and the acoustic sensing system shown in FIG. 2.

Accordingly, the acoustic sensing system 100 provided herein uses a number of acoustic sensors 101 to detect the movement of the Thomson coil actuator 40 during an opening stroke. The acoustic sensors 101 are in electrical communication with a processor such that the processor can analyze the data detected by the sensors 101. The processor can, for example and without limitation, be a component of the control module 12. For the sake of brevity, the processor with which the sensors 101 communicate will be assumed to be a component of the control module 12, and the sensors 101 will be described as communicating with the control module 12 (as depicted in FIG. 3), however, it is to be understood that the processor can instead be a component separate from the control module 12, without departing from the scope of the disclosed concept. The operation of the acoustic sensing system 100 will now be detailed with reference to FIG. 3, which shows an enlarged view of a portion of FIG. 2 in order to better highlight details of the Thomson coil actuator 40 and the acoustic sensing system 100.

In FIG. 3, the number of acoustic sensors 101 includes a proximal sensor 102 and a distal sensor 104. The proximal sensor 102 is mounted to the proximal flange 47 of the Thomson coil actuator 40 and the distal sensor 104 is mounted to the distal flange 48 of the Thomson coil actuator 40. The proximal sensor 102 and the distal sensor 104 are identical, and are only differentiated by their respective mounting positions within the structure of the Thomson coil actuator 40. The proximal sensor 102 and the distal sensor 104 may be referred to collectively as the acoustic sensors 101. Each sensor 102, 104 comprises a respective sound wave transmitter-receiver 103, 105, and both transmitter-receivers 103, 105 are structured to emit and receive sound waves. While either only the proximal sensor 102 or only the distal sensor 104 needs to be included in the monitoring system 100 in order to effectively detect the movement of the Thomson coil actuator moving assembly 46, both can be included without departing from the scope of the disclosed concept.

Because the transmitter-receiver 103 is disposed so as to face the distal flange 48, substantial portions of sound waves emitted by the transmitter-receiver 103 get reflected off of the distal flange 48, and the reflected acoustic signal is subsequently received by the transmitter-receiver 103. Similarly, because the transmitter-receiver 105 is disposed so as to face the proximal flange 47 and the Thomson coil housing 49, substantial portions of sound waves emitted by the transmitter-receiver 105 get reflected off of the proximal flange 47 and the Thomson coil housing 49, and the reflected acoustic signal is subsequently received by the transmitter-receiver 105. It will be noted that the conductive plate 42 comprises a proximal surface 51 and a distal surface 53. When the Thomson coil actuator actuates opening of the moving contact 24, the travel of the moving contact 24 can be gauged by either the movement of the conductive plate proximal surface 51 or the movement of the conductive plate distal surface 53.

When the Thomson coil moving assembly 46 is closed, the conductive plate proximal surface 51 is disposed at a position 201, and at the end of an ultra-fast opening stroke, the conductive plate proximal surface 51 is disposed at a position 202, such that actuation of an opening stroke results in the conductive plate proximal surface 51 traveling a distance 204. It will be appreciated that the distal surface 53 of the conductive plate 42 travels the same distance 204 during an opening stroke, and that the distance 206 between the transmitter-receiver 105 and the conductive plate distal surface 53 decreases by the distance 204 between the beginning and end of an opening stroke. As detailed further hereinafter, the proximal sensor 102 detects the movement of the Thomson coil moving assembly 46 based on the movement of the proximal surface 51, while the distal sensor 104 detects the movement of the Thomson coil moving assembly 46 based on the movement of the distal surface 53. As used herein, the term "detection target" can be used to refer to a component or portion of a component that is sensed or monitored by an acoustic sensor 101 in order to detect movement of the Thomson coil moving assembly 46. Accordingly, the proximal surface 51 can be referred to as the detection target for the acoustic sensor 102, and the distal surface 53 can be referred to as the detection target for the distal sensor 104.

Figure 4:
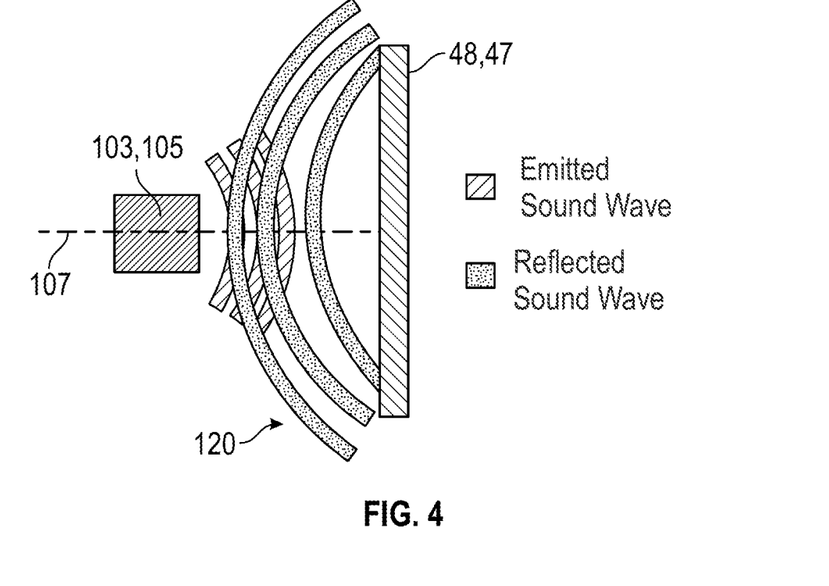
FIG. 4 shows a symbolic depiction of sound waves being emitted by an acoustic sensor shown in FIG. 3 and reflected off of components of the Thomson coil assembly shown in FIG. 3, during active acoustic sensing performed by the acoustic sensing system shown in FIG. 3, in accordance with an exemplary embodiment of the disclosed concept.

The acoustic sensing system 100 can perform either active sensing (as described hereinafter in relation to FIG. 4) or passive sensing (as described later herein in relation to FIG. 5), without departing from the scope of the disclosed concept. Referring now to FIG. 4 in conjunction with FIG. 3, sound waves emitted by the transmitter-receivers 103, 105 during active acoustic sensing performed by the acoustic sensing system 100 are symbolically depicted, in accordance with exemplary embodiments of the disclosed concept. It is noted that sound waves with no obstacles in their path of propagation are known to be approximately spherical. FIG. 4 depicts sound waves originating and being emitted from the central axis 107 of the transmitter-receivers 103, 105 and being reflected off of the respective distal and proximal flanges 48, 47 so that the reflected sound waves are received by the transmitter-receivers 103, 105. The amplitude of the waves emitted by the sensors 101 can be chosen appropriately to ensure reflection rather than absorption. For the sake of simplicity, FIG. 4 does not depict the several solid components encountered by the spherical sound waves emitted by the transmitter-receivers 103, 105 as the emitted sound waves propagate toward the distal flange 48 or proximal flange 47 (e.g. the conductive plate 42, the Thomson coil housing 49 etc.), but it should be understood that there are various solid components that the emitted sound waves do encounter in the propagation path between the transmitter-receivers 103, 105 and the flanges 48, 47, as discussed herein below.

In FIG. 4, the peaks of the sound waves coincide with the transmitter-receiver central axis 107, and the peripheral portions 120 of the sound waves are those portions of the sound waves disposed outward from the central axis 107. It will be appreciated that when the transmitter-receivers 103, 105 emit sound waves toward the respective distal and proximal flanges 48, 47, the peripheral portions 120 of the emitted waves encounter the conductive plate 42, among other components of the Thomson coil actuator 40. Specifically, peripheral portions 120 of the emitted sound waves emitted by the transmitter-receiver 103 encounter the conductive plate proximal surface 51, and peripheral portions 120 of sound waves emitted by the transmitter-receiver 105 encounter the conductive plate distal surface 53.

While the circuit interrupter 1 is in operation, the acoustic sensors 101 continuously emit sound waves and receive reflected acoustic signals. The frequency of the wave emissions can be chosen so as to not coincide with the frequencies of noises expected to be present in the environment of the circuit interrupter. It will be appreciated that the emitted sound wave peripheral portions 120 that encounter the conductive plate 42 get reflected back to the transmitter-receiver 103, 105 sooner than the sound wave portions that do not encounter any solid components before reaching the flanges 48, 47. As the position of the conductive plate 42 changes during an opening stroke or during closing, the time it takes for the sound wave peripheral portions 120 to be received by the transmitter-receivers 103, 105 after being reflected by the conductive plate 42 changes correspondingly, while the time it takes for the wave portions that encounter the flanges 48, 47 (or other fixed components) to get reflected and received by the receiver-transmitters 103, 105 remains the same.

Hence, there is a unique reflected acoustic signal that corresponds to each of the closed position, the open position, and every intermediate position that the conductive plate 42 assumes as it travels between the closed and open positions during an opening stroke or during closing. The time it takes to complete an opening stroke or to close the moving assembly 46 can thus be determined by finding: (1) the time at which the unique reflected acoustic signal associated with the closed position of the conductive plate 42 occurs, and (2) finding the time at which the unique reflected acoustic signal associated with the fully open position of the conductive plate 42 occurs. The processor of the control module 12 is programmed to recognize the reflected acoustic signals associated with the closed and open positions prior to commissioning of the circuit interrupter 1, and is able to distinguish an opening stroke from a closing stroke by comparing successive received acoustic signals. That is, in comparing one reflected acoustic signal to the next reflected acoustic signal that is received by a transmitter-receiver 103, 105, the change in the signal component corresponding to the position of the conductive plate 42 will indicate whether the conductive plate 42 is moving toward or away from the transmitter-receiver 103, 105.

Acoustic sensors are highly versatile and can sense acoustic waves propagating through either air or solid structures. While the proximal and distal flanges 47, 48 are used herein as non-limiting illustrative examples of locations within the Thomson coil actuator 40 that are suitable for mounting the acoustic sensors 101 in order to detect movement of the Thomson coil moving assembly 46 in the active acoustic sensing mode (FIG. 4), it should be noted that the acoustic sensors 101 can be mounted at several other locations throughout the structure of the Thomson coil actuator 40 without departing from the scope of the disclosed concept. In the active acoustic sensing mode, it will be appreciated that the acoustic sensors 102, 104 are effective for sensing movement of the conductive plate 42 (i.e. the detection target) due to the fact that the conductive plate 42 is disposed at least partially in the propagation path of sound waves emitted by the transmitter-receivers 103, 105. However, any component or portion of the Thomson coil moving assembly 46 can serve as a detection target for an acoustic sensor 101 in the active acoustic sensing mode, provided that the component or portion is disposed at least partially in the propagation path of sound waves emitted by the acoustic sensor 101.

Figure 5:
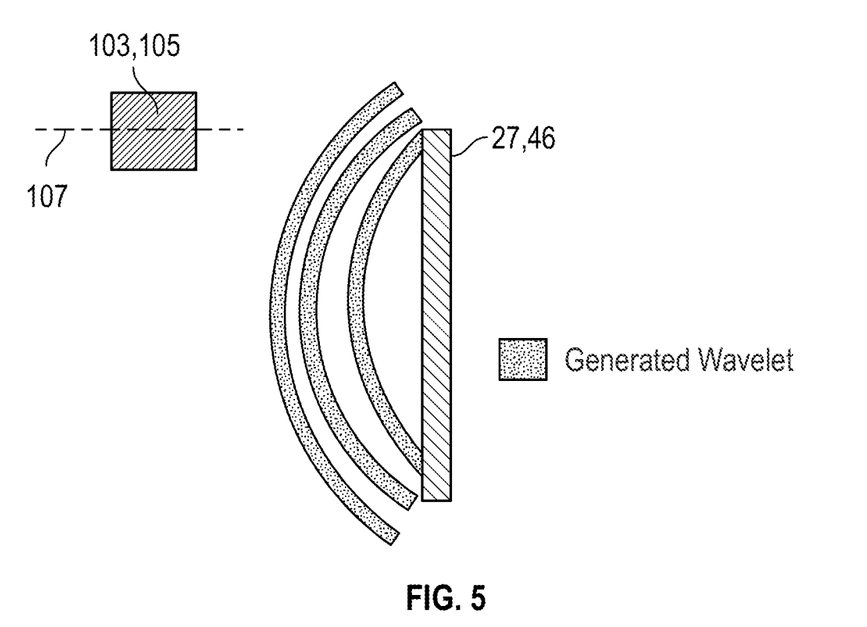
FIG. 5 shows a symbolic depiction of acoustic wavelets generated by components of the Thomson coil assembly shown in FIG. 3, during passive acoustic sensing performed by the acoustic sensing system shown in FIG. 3, in accordance with an exemplary embodiment of the disclosed concept.

Referring now to FIG. 5, in conjunction with FIG. 3, acoustic wavelets generated by moving components of the hybrid circuit interrupter (shown in FIG. 2) during passive acoustic sensing performed by the acoustic sensing system 100 are symbolically depicted, in accordance with exemplary embodiments of the disclosed concept. It is noted that the acoustic sensing system 100 can be selectively operated to perform in either of the active acoustic sensing mode or passive acoustic sensing mode. In contrast with the active acoustic sensing method depicted in FIG. 4, wherein the processor of the control module 12 analyzes reflected acoustic signals after the transmitter-receivers 103, 105 emit sound waves toward a detection target, when the passive acoustic sensing method depicted in FIG. 5 is performed, the transmitter-receivers 103, 105 of the acoustic sensors 101 do not emit sound waves but instead detect acoustic wavelets generated as a result of the various moving components of the circuit interrupter 1 moving during opening and closing operations. It will be appreciated that, for each given moving component in the circuit interrupter 1 (e.g. the drive rod 27 and the various components of the Thomson coil moving assembly 46, such as the conductive plate 42 and the actuator coupler 43), the given component generates acoustic wavelets that are unique to that given component during an opening operation and during a closing operation. As used herein, the term "wavelet" refers to an oscillating signal with an amplitude that begins at zero, increases or decreases, and then returns to zero one or more times. It will be appreciated that the characteristics of each wavelet are a unique function of the distance of the component from each acoustic sensor 101 and the speed of movement of the component, among other factors. Accordingly, each wavelet sensed by an acoustic sensor 101 can be thought of as an acoustic signature that is unique to the specific component generating the wavelet. Prior to commissioning of the circuit interrupter 1, for all moving components for which monitoring is desired in the passive mode (i.e. the detection targets for the passive mode), the processor of the control module 12 is programmed to recognize the characteristics of acoustic wavelets associated with each of the detection targets during the opening and closing processes, i.e. the acoustic signature of each detection target for the opening and closing processes.

With the processor of the control module 12 being programmed to recognize the acoustic signature of each detection target, the processor can determine and track a variety of metrics, including but not limited to the onset times of opening and closing operations, as well the motion profile of each detection target. While the drive rod 27 and Thomson coil moving assembly 46 are schematically depicted in FIG. 5 as being suitable detection targets, it should be noted that other moving components can be monitored using the passive acoustic sensing method instead of or in addition to the drive rod 27 and Thomson coil moving assembly 46, without departing from the scope of the disclosed concept. In FIG. 5, the transmitter-receiver 103, 105 is depicted as being positioned such that its central axis 107 does not coincide with the amplitude of the wavelets generated by the detection targets 27, 46. It should be noted that this positioning is used in FIG. 5 to denote that a given transmitter-receiver 103 may be used to monitor more than one component and thus, the central axis 107 may not coincide with the amplitude of some or any of the generated wavelets.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A hybrid circuit interrupter, the circuit interrupter comprising:
   a housing;
   a line conductor structured to connect a load to a power source;
   a hybrid switch assembly disposed along the line conductor between the power source and the load, the hybrid switch assembly comprising:
   mechanical separable contacts structured to move between a closed state and an open state, the mechanical separable contacts comprising a stationary contact and a moving contact; and
   an electronic interrupter structured to commutate current from the mechanical separable contacts when a fault is detected on the line conductor;

a Thomson coil actuator structured to open the mechanical separable contacts at ultra-fast speeds, the Thomson coil actuator comprising:
a Thomson coil;
a plurality of structural support components structured to remain fixed in place; and
a moving assembly comprising a conductive plate structured to be actuated by the Thomson coil in order to open the separable contacts;
a drive rod fixedly coupled to the conductive plate and operably coupled to the moving separable contact; and
an acoustic sensing system, the acoustic sensing system comprising:
a processor; and
an acoustic sensor mounted to one of the structural support components and configured to be in electrical communication with the processor,
wherein the acoustic sensor is configured to detect movement of the moving assembly, and
wherein the processor is configured to determine how much time elapses when the moving assembly moves from one position to another based on movement detected by the acoustic sensor.

2. The circuit interrupter of claim 1, wherein the acoustic sensing system is configured to be operated in an active acoustic sensing mode in which:
the acoustic sensor is configured to continuously emit sound waves in a propagation path,
a portion of the moving assembly comprises a detection target that falls within a portion of the propagation path, and
each unique position that the detection target can assume between a closed position and a fully open position corresponds to a corresponding unique reflected acoustic signal.

3. The circuit interrupter of claim 2,
wherein the detection target comprises the conductive plate.

4. The circuit interrupter of claim 3,
wherein the Thomson coil actuator is structured to drive the moving contact two millimeters away from a closed position in less than 1,000 microseconds.

5. The circuit interrupter of claim 1,
wherein the plurality of structural support components comprises a coil housing that houses the Thomson coil, a proximal flange disposed on a proximal side of the coil housing, and a distal flange disposed on a distal side of the coil housing,
wherein the acoustic sensor is mounted to the proximal flange and configured to emit sound waves toward the distal flange,
wherein each emitted sound wave is selected to have properties enabling the distal flange to reflect the emitted sound wave toward the acoustic sensor as a reflected acoustic signal, and
wherein each unique position that the conductive plate can assume between a closed position and a fully open position corresponds to a corresponding unique reflected acoustic signal.

6. The circuit interrupter of claim 5,
wherein the acoustic sensor is positioned such that a portion of each emitted sound wave encounters a proximal side of the conductive plate,
wherein each emitted sound wave is selected to have properties enabling the conductive plate to reflect the portion of the sound wave toward the acoustic sensor as part of the reflected acoustic signal.

7. The circuit interrupter of claim 1,
wherein the plurality of structural support components comprises a coil housing that houses the Thomson coil, a proximal flange disposed on a proximal side of the coil housing, and a distal flange disposed on a distal side of the coil housing,
wherein the acoustic sensor is mounted to the distal flange and configured to emit sound waves toward the proximal flange,
wherein the emitted sound waves are selected to have properties enabling the proximal flange to reflect the sound waves toward the acoustic sensor as a reflected acoustic signal, and
wherein each position that the conductive plate can assume between a closed position and a fully open position corresponds to a unique reflected acoustic signal.

8. The circuit interrupter of claim 7,
wherein the acoustic sensor is positioned such that a portion of each emitted sound wave encounters a distal side of the conductive plate, and
wherein each emitted sound wave is selected to have properties enabling the conductive plate to reflect the portion of the sound wave toward the acoustic sensor as part of the reflected acoustic signal.

9. The circuit interrupter of claim 1,
wherein the acoustic sensor is positioned in order to detect acoustic wavelets generated by at least one of the conductive plate and the drive rod during opening operations and closing operations, and
wherein the processor is configured to determine, for each detected acoustic wavelet, which component generated the detected acoustic wavelet, and what the position of the component was when the component generated the detected acoustic wavelet.

10. The circuit interrupter of claim 2,
wherein the acoustic sensing system is further configured to be selectively operated in either the active acoustic sensing mode or a passive acoustic sensing mode, and
wherein, in the passive acoustic sensing mode:
the acoustic sensor is positioned in order to detect acoustic wavelets generated by at least one of the conductive plate and the drive rod during opening operations and closing operations, and
the processor is configured to determine, for each detected acoustic wavelet, which component generated the detected acoustic wavelet, and what the position of the component was when it generated the detected acoustic wavelet.

11. A circuit interrupter, the circuit interrupter comprising:
a housing;
a line conductor structured to connect a load to a power source;
mechanical separable contacts disposed along the line conductor between the power source and the load and structured to move between a closed state and an open state, the mechanical separable contacts comprising a stationary contact and a moving contact;
a Thomson coil actuator structured to open the mechanical separable contacts at ultra-fast speeds, the Thomson coil actuator comprising:
a Thomson coil;
a plurality of structural support components structured to remain fixed in place; and
a moving assembly comprising a conductive plate structured to be actuated by the Thomson coil in order to open the separable contacts;

a drive rod fixedly coupled to the conductive plate and operably coupled to the moving separable contact; and a solenoid actuator structured to open the mechanical separable contacts at normal speeds and close the mechanical separable contacts; and an acoustic sensing system, the actuator sensing system comprising:

a processor; and an acoustic sensor mounted to one of the structural support components and configured to be in electrical communication with the processor, wherein the acoustic sensor is configured to detect movement of the moving assembly, and wherein the processor is configured to determine how much time elapses when the moving assembly moves from one position to another based on movement detected by the acoustic sensor.

12. The circuit interrupter of claim 11, wherein the acoustic sensing system is configured to be operated in an active acoustic sensing mode in which:

the acoustic sensor is configured to continuously emit sound waves in a propagation path, a portion of the moving assembly comprises a detection target that falls within a portion of the propagation path, and each unique position that the detection target can assume between a closed position and a fully open position corresponds to a corresponding unique reflected acoustic signal.

13. The circuit interrupter of claim 12, wherein detection target comprises the conductive plate.

14. The circuit interrupter of claim 13, wherein the Thomson coil actuator is structured to drive the moving contact two millimeters away from a closed position in less than 1,000 microseconds.

15. The circuit interrupter of claim 11, wherein the plurality of structural support components comprises a coil housing that houses the Thomson coil, a proximal flange disposed on a proximal side of the coil housing, and a distal flange disposed on a distal side of the coil housing, wherein the acoustic sensor is mounted to the proximal flange and configured to emit sound waves toward the distal flange, wherein each emitted sound wave is selected to have properties enabling the distal flange to reflect the emitted sound wave toward the acoustic sensor as a reflected acoustic signal, and wherein each unique position that the conductive plate can assume between a closed position and a fully open position corresponds to a corresponding unique reflected acoustic signal.

16. The circuit interrupter of claim 15, wherein the acoustic sensor is positioned such that a portion of each emitted sound wave encounters a proximal side of the conductive plate, and wherein each emitted sound wave is selected to have properties enabling the conductive plate to reflect the portion of the sound wave toward the acoustic sensor as part of the reflected acoustic signal.

17. The circuit interrupter of claim 11, wherein the plurality of structural support components comprises a coil housing that houses the Thomson coil, a proximal flange disposed on a proximal side of the coil housing, and a distal flange disposed on a distal side of the coil housing, wherein the acoustic sensor is mounted to the distal flange and configured to emit sound waves toward the proximal flange, wherein the emitted sound waves are selected to have properties enabling the proximal flange to reflect the sound waves toward the acoustic sensor as a reflected acoustic signal, and wherein each position that the conductive plate can assume between a closed position and a fully open position corresponds to a unique reflected acoustic signal.

18. The circuit interrupter of claim 17, wherein the acoustic sensor is positioned such that a portion of each emitted sound wave encounters a distal side of the conductive plate, and wherein each emitted sound wave is selected to have properties enabling the conductive plate to reflect the portion of the sound wave toward the acoustic sensor as part of the reflected acoustic signal.

19. The circuit interrupter of claim 11, wherein the acoustic sensor is positioned in order to detect acoustic wavelets generated by at least one of the conductive plate and the drive rod during opening operations and closing operations, and wherein the processor is configured to determine, for each detected acoustic wavelet, which component generated the detected acoustic wavelet, and what the position of the component was when the component generated the detected acoustic wavelet.

20. The circuit interrupter of claim 12, wherein the acoustic sensing system is further configured to be selectively operated in either the active acoustic sensing mode or a passive acoustic sensing mode, and wherein, in the passive acoustic sensing mode:

the acoustic sensor is positioned in order to detect acoustic wavelets generated by at least one of the conductive plate and the drive rod during opening operations and closing operations, and the processor is configured to determine, for each detected acoustic wavelet, which component generated the detected acoustic wavelet, and what the position of the component was when the component generated the detected acoustic wavelet.

* * * * *